(12) United States Patent
Wu et al.

(10) Patent No.: US 8,994,016 B2
(45) Date of Patent: Mar. 31, 2015

(54) DIELECTRIC LAYER FOR AN ELECTRONIC DEVICE

(71) Applicant: Xerox Corporation, Norwalk, CT (US)

(72) Inventors: Yiliang Wu, Oakville (CA); Ping Liu, Mississauga (CA); Nan-Xing Hu, Oakville (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 13/968,568

(22) Filed: Aug. 16, 2013

(65) Prior Publication Data

US 2013/0331512 A1   Dec. 12, 2013

Related U.S. Application Data

(63) Continuation of application No. 12/474,346, filed on May 29, 2009, now Pat. No. 8,513,650.

(51) Int. Cl.
| | | |
|---|---|---|
| *H01L 29/76* | (2006.01) | |
| *H01B 3/38* | (2006.01) | |
| *H01L 21/02* | (2006.01) | |
| *H01L 21/312* | (2006.01) | |
| *H01L 51/05* | (2006.01) | |
| *H01L 51/00* | (2006.01) | |

(52) U.S. Cl.
CPC ............ *H01B 3/38* (2013.01); *H01L 21/02123* (2013.01); *H01L 21/3121* (2013.01); *H01L 51/052* (2013.01); *H01L 51/0036* (2013.01); *H01L 51/0043* (2013.01); *H01L 51/0545* (2013.01)
USPC ......... 257/40; 257/66; 257/632; 257/E29.162

(58) Field of Classification Search
CPC ............ H01L 51/0035; H01L 51/0043; H01L 51/052; H01L 51/0545; H01L 21/02123; H01L 21/3121; H01B 3/38
USPC ................................ 257/40, 66, 632, E29.162
See application file for complete search history.

(56) References Cited

U.S. PATENT DOCUMENTS

| | | | |
|---|---|---|---|
| 4,883,739 A | 11/1989 | Sakaguchi et al. | |
| 2007/0154836 A1 | 7/2007 | Meagley | |

(Continued)

FOREIGN PATENT DOCUMENTS

| | | | |
|---|---|---|---|
| EP | 0 402 785 A1 | 6/1990 | |
| EP | 1 998 224 A1 | 3/2008 | |

(Continued)

OTHER PUBLICATIONS

Lawson, Richard et al.: "Influence of solubility switching mechanism on resist performance in molecular glass resists", *Journal of Vacuum Science and Technology: Part B, AVA/AIP*, Melville, New York, NY, US, vol. 25, No. 6, Dec. 7, 2007, pp. 2140-2144.

(Continued)

*Primary Examiner* — Colleen A Matthews
*Assistant Examiner* — Colleen E Snow
(74) *Attorney, Agent, or Firm* — Fay Sharpe LLP

(57) ABSTRACT

A dielectric layer for an electronic device, such as a thin-film transistor, is provided. The dielectric layer comprises a molecular glass. The resulting dielectric layer is very thin, pure, and stable. Processes and compositions for fabricating such a dielectric layer are also disclosed.

17 Claims, 2 Drawing Sheets

(56) References Cited

U.S. PATENT DOCUMENTS

| | | |
|---|---|---|
| 2008/0044757 A1 | 2/2008 | De Silva et al. |
| 2009/0004596 A1 | 1/2009 | Bucchignano et al. |
| 2011/0260114 A1 | 10/2011 | Wu et al. |

FOREIGN PATENT DOCUMENTS

| | | |
|---|---|---|
| JP | 2002-356551 A | 12/2002 |
| KR | 10-2009-0106397 | 10/2009 |
| WO | WO 00/05292 | 2/2000 |
| WO | WO 2007/094784 A1 | 8/2007 |
| WO | WO 2009/143482 A2 | 11/2009 |

OTHER PUBLICATIONS

Kim, Jin-Baek et al.: "Nanomolecular Resists with Adamantane Core for 193-nm Lithography", *Proceedings of SPIE*, SPIE, Wellingham, WA, US, vol. 5753, Mar. 2, 2005, pp. 603-610.

Sailer, H et al.: "High resolution electron beam lithography using a chemically amplified calix[4]arene based resist", *Journal of Vacuum Science & Technology B: Microelectronicsprocessing and Phenomena, American Vacuum Society*, New York, NY, US, vol. 22, No. 6, Nov. 1, 2004, pp. 3485-3488.

Chen, Shaw H. et al.: "Novel Glass-Forming Organic Materials. 1. Adamantane with Pendant Cholesteryl, Disperse Red 1, and Nematogenic Groups", *Macromolecules, American Chemical Society*, Washington, DC, US, vol. 28, No. 23, Nov. 6, 1995, pp. 7775-7778.

Extended European Search Report for corresponding European Application No. 10163203.2; dated Aug. 19, 2013.

Pfeiffer et al., "Towards environmentally friendly, dry deposited, water developable molecular glass photoresists," Phys. Chem. Chem. Phys., 2008, 10, pp. 1257-1262.

Dai et al., "Molecular Glass Resists for High-Resolution Patterning," Chem. Mater. 2006, 18, pp. 3404-3411.

Halik et al., "Low-voltage organic transistors with an amorphous molecular gate dielectric," Nature, vol. 431, pp. 963-966, Oct. 21, 2004, Nature Publishing Group.

Reu et al., "Properties and Performance of Molecular Glass Photoresists," NNIN REU Research Accomplishments, pp. 34-35, 2005.

DIELECTRIC LAYER FOR AN ELECTRONIC DEVICE

This application is a continuation of U.S. patent application Ser. No. 12/474,346, filed May 29, 2009, now U.S. Pat. No. 8,513,650. The entirety of that application is hereby fully incorporated by reference herein.

BACKGROUND

The present disclosure relates, in various embodiments, to thin-film transistors (TFTs) and/or other electronic devices comprising a dielectric layer. The dielectric layer is made from molecular glasses (amorphous molecular materials). Also disclosed are processes and compositions for fabricating a dielectric layer.

Organic thin-film transistors (OTFTs) can potentially be fabricated using solution-based patterning and deposition techniques, such as spin coating, solution casting, dip coating, stencil/screen printing, flexography, gravure, offset printing, ink jet-printing, micro-contact printing, and the like, or a combination of these processes. Such processes are generally simpler and more cost effective compared to the complex photolithographic processes used in fabricating silicon-based thin film transistor circuits for electronic devices. To enable the use of these solution-based processes in fabricating thin film transistor circuits, solution processable materials are therefore required.

TFTs are generally composed of, on a substrate, an electrically conductive gate electrode, source and drain electrodes, an electrically insulating gate dielectric layer which separates the gate electrode from the source and drain electrodes, and a semiconducting layer which is in contact with the gate dielectric layer and bridges the source and drain electrodes. Their performance can be determined by the field effect mobility and the current on/off ratio. High mobility and high on/off ratio are desired.

The gate dielectric layer, in particular, should be free of pinholes and possess low surface roughness (or high surface smoothness), low leakage current, a high dielectric constant, a high breakdown voltage, adhere well to the gate electrode, be stable in solution at room temperature, and offer other functionality. It should also be compatible with semiconductor materials because the interface between the dielectric layer and the organic semiconductor layer critically affects the performance of the TFT.

Most solution processable polymers used in gate dielectric layers usually have low dielectric constants and do not contain crosslinkable functional groups, so a considerable dielectric thickness is required to reduce gate leakage current to an acceptable level. As a result, the capacitance of the dielectric layer is usually low, leading to high operating voltage and low mobility.

Various polymeric materials such as polyimides (PI), poly (vinylphenol) (PVP), and poly(methyl methacrylate) (PMMA) have been studied for use in the gate dielectric layer. However, these polymeric materials have several disadvantages. For example, polymers have a high molecular weight and polydispersity. Thus, it is difficult to purify them so that they can be used as electronic grade materials. Polymers also have a wide distribution of functional groups, which can cause non-uniform crosslinking, so that the resulting dielectric layer does not have uniform properties across its surface. As a result, gate dielectric layers must generally be thick in order to prevent such operating difficulties.

It would be desirable to provide materials which can be purified to electronic grade, and are capable of being used to form a dielectric layer of reduced thickness while maintaining the desired electrical properties.

BRIEF DESCRIPTION

The present application discloses, in various exemplary embodiments, dielectric layers for electronic devices, such as thin film transistors, formed with such layers. The dielectric layers comprise an amorphous molecular material, also known as a molecular glass. Also disclosed are various processes and compositions for producing such dielectric layers and/or the electronic devices comprising the same.

Disclosed in further embodiments, the molecular glass is an insulative material having a conductivity less than $10^{-10}$ S/cm, including less than $10^{-12}$ S/cm.

Disclosed in some embodiments is a thin film transistor comprising a dielectric layer, wherein the dielectric layer comprises a molecular glass.

The molecular glass may have a linear, T-type, tripodal, or tetrahedral structure. The molecular glass can comprise one or more functional groups selected from the group consisting of hydroxyl, amino, isocyanate, carboxylic acid, ester, alkoxy, and epoxy functional groups.

The molecular glass may be selected from the group consisting of phenolic molecular glass, amino molecular glass, carboxylic acid molecular glass, epoxy molecular glass, methoxy molecular glass, ester molecular glass, and isocyanate molecular glass. The molecular glass may be a derivative of a compound selected from the group consisting of a spiro compound, a bisphenol-A compound, a tetrahedral aryl silane compound, an adamantane compound, a cyclic compound, and a triaryl amine compound.

The molecular glass may have a glass transition temperature of from about 25 degrees C. to about 350 degrees C.

The molecular glass may be a spiro compound of Formula (1) or Formula (2):

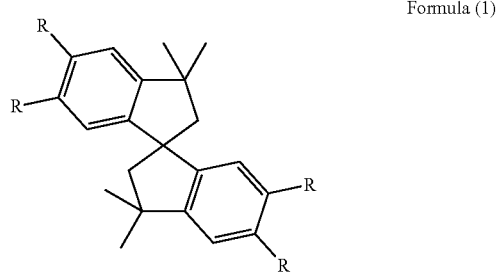

Formula (1)

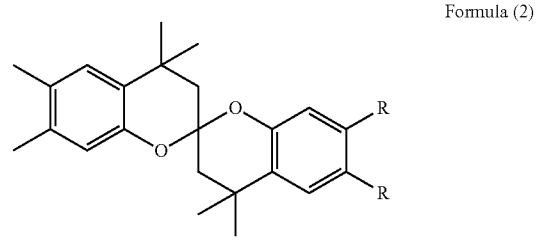

Formula (2)

wherein each R substituent is independently selected from the group consisting of hydrogen, hydroxyl, protected hydroxyl, amino, $-OC_2H_5$, $-OCH_3$, $-OCOOC_4H_9$, $-CNO$, hydroxyphenyl, $-COON$, and epoxy.

In particular embodiments, the spiro compound has the structure of Formula (1a) or Formula (2a):

Formula (1a)

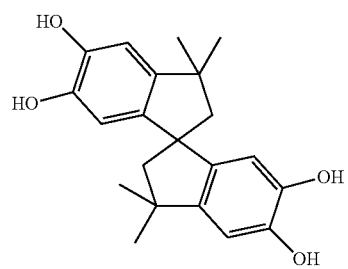

Formula (2a)

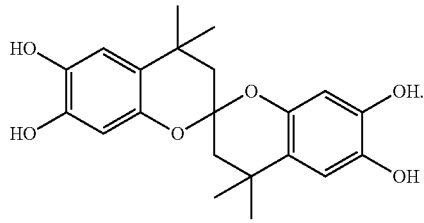

Alternatively, the molecular glass is a bisphenol-A derivative selected from one of Formula (3) to Formula (8):

Formula (3)

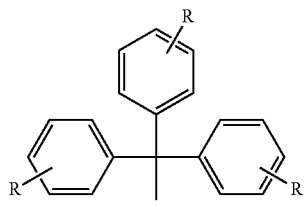

Formula (4)

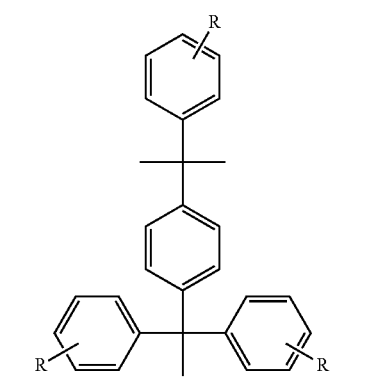

Formula (5)

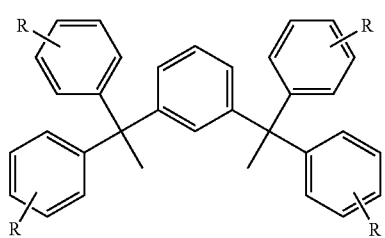

Formula (6)

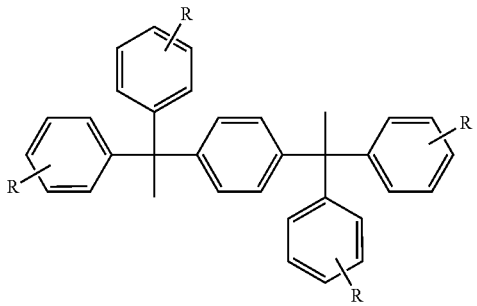

Formula (7)

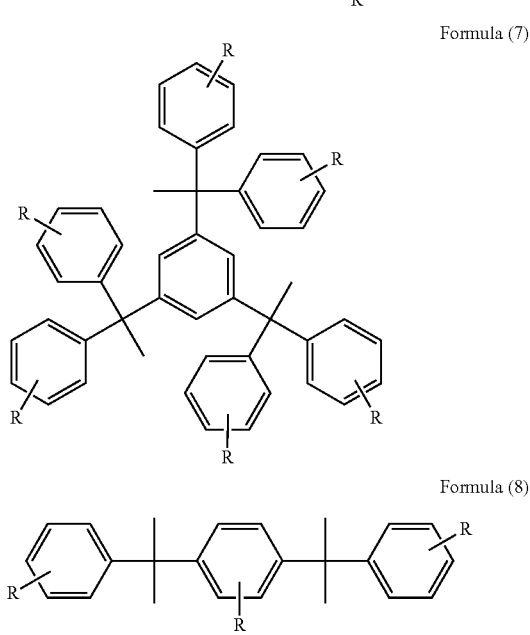

Formula (8)

wherein each R is independently selected from the group consisting of hydrogen, hydroxyl, protected hydroxyl, amino, —$OC_2H_5$, —$OCH_3$, —$OCOOC_4H_9$, —CNO, hydroxyphenyl, —COOH, and epoxy.

The molecular glass may also be a tetrahedral silane derivative of Formula (9):

Formula (9)

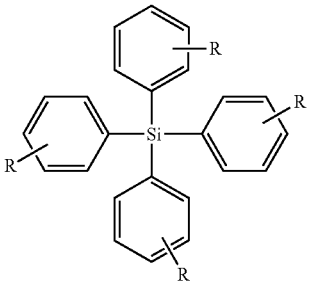

wherein each R is independently selected from the group consisting of hydrogen, hydroxyl, protected hydroxyl, amino, —$OC_2H_5$, —$OCH_3$, —$OCOOC_4H_9$, —CNO, hydroxyphenyl, —COOH, and epoxy.

In some embodiments, the molecular glass may be an adamantane derivative of Formula (10):

Formula (10)

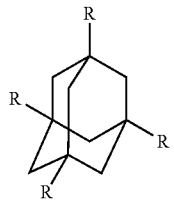

wherein each R is independently hydrogen or a substituent comprising a heteroatom such as oxygen and nitrogen.

The molecular glass may alternatively be a cyclic system selected from one of Formula (11) to Formula (14):

Formula (11)

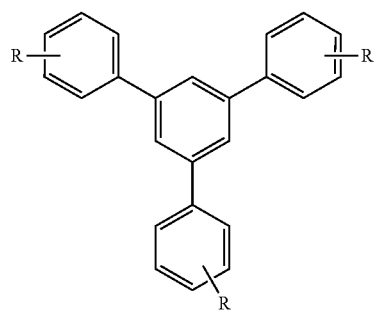

Formula (12)

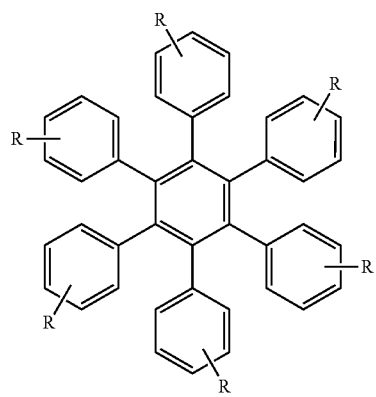

Formula (13)

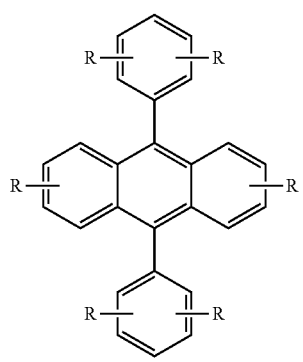

Formula (14)

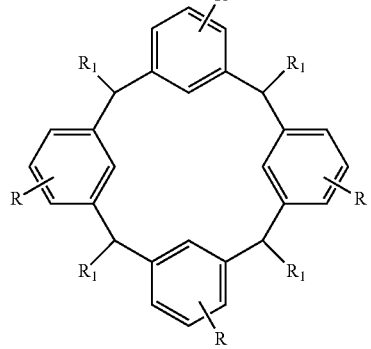

wherein each R is independently selected from the group consisting of hydrogen, hydroxyl, protected hydroxyl, amino, $-OC_2H_5$, $-OCH_3$, $-OCOOC_4H_9$, $-CNO$, hydroxyphenyl, $-COOH$, and epoxy; and $R_1$ is a phenyl group substituted with an oxygen-containing moiety.

If desired, the molecular glass may be a triarylamine derivative selected from one of Formula (15) to Formula (17):

Formula (15)

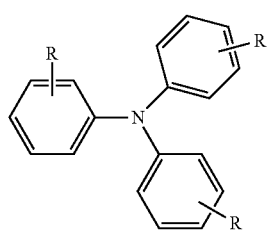

Formula (16)

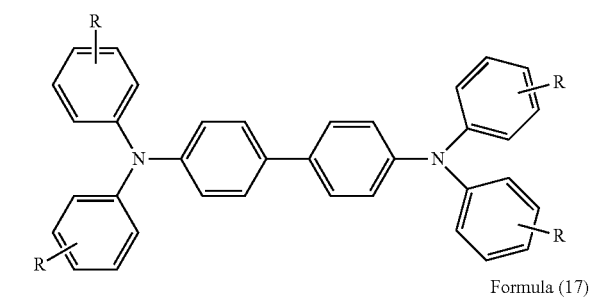

Formula (17)

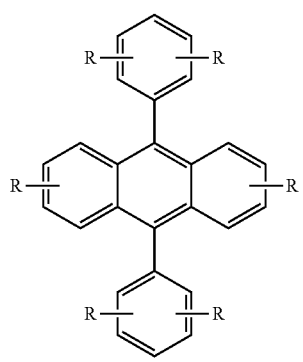

wherein each R is independently selected from the group consisting of hydrogen, hydroxyl, protected hydroxyl, amino, $-OC_2H_5$, $-OCH_3$, $-OCOOC_4H_9$, $-CNO$, hydroxyphenyl, $-COOH$, and epoxy.

The dielectric layer may optionally further comprise a crosslinking agent which is crosslinked with the molecular glass. For example, a crosslinking agent such as 1,3,4,6-tetrakis(methoxylmethyl)glycoluril, a melamine-formaldehyde resin, or a phenol-formaldehyde resin may be included.

Alternatively, the molecular glass may be crosslinked with itself (i.e. self-crosslinking). The molecular glass may have a molecular weight of from about 200 to about 5000, including from about 250 to about 3000.

Other embodiments relate to a thin film transistor comprising a dielectric layer, wherein the dielectric layer is formed from a composition comprising: an amorphous molecular glass; an optional crosslinking agent; and an optional catalyst such as an acid. The optional catalyst may be toluene sulfonic acid or a photoacid generator.

In still other embodiments, the thin film transistor comprises a dielectric layer, wherein the dielectric layer is formed by the crosslinking of: a crosslinking agent; and a molecular glass selected from the group consisting of formulas (1a), (2a), and structures (a) to (e):

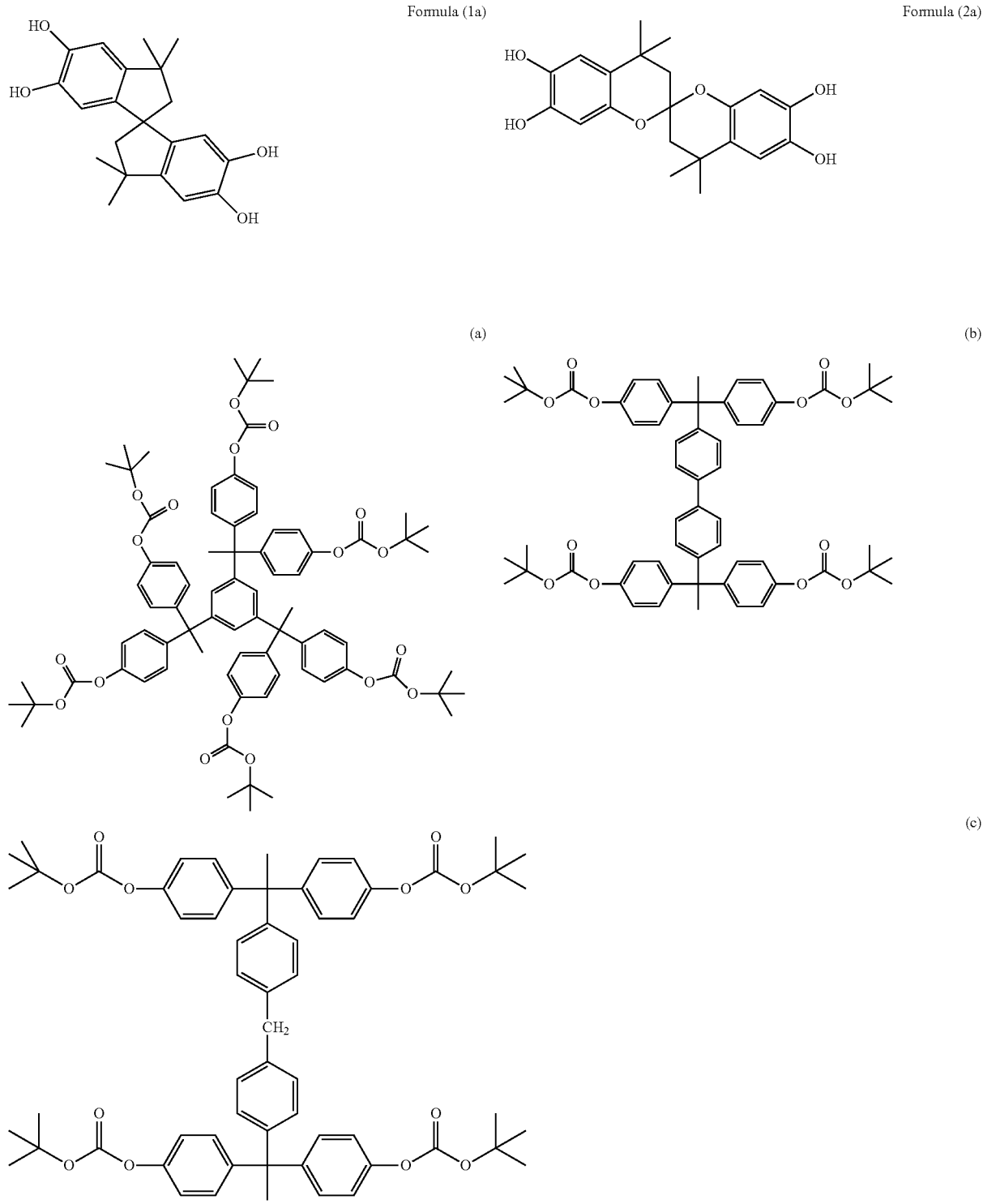

(d)

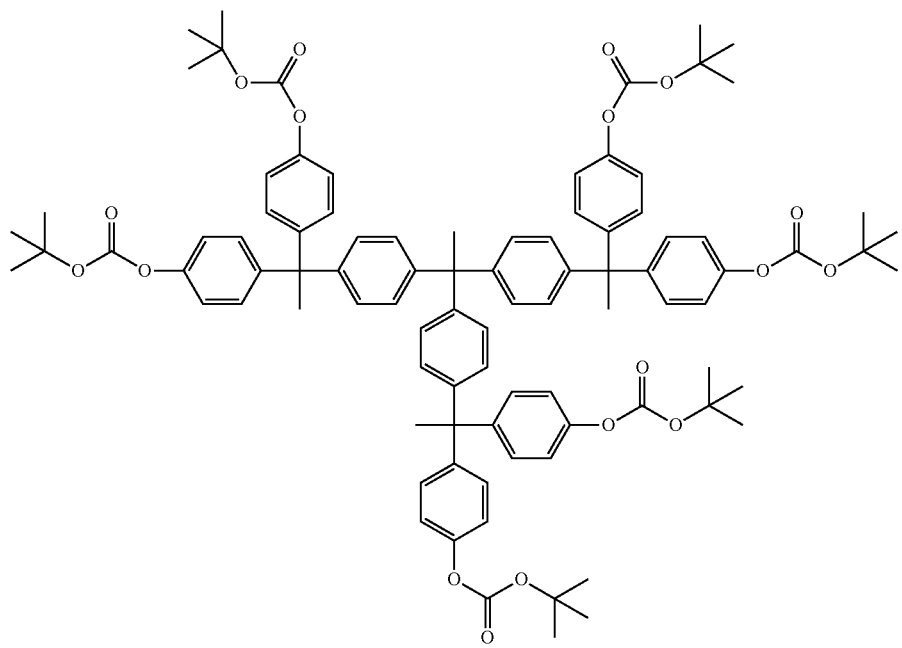

(e)

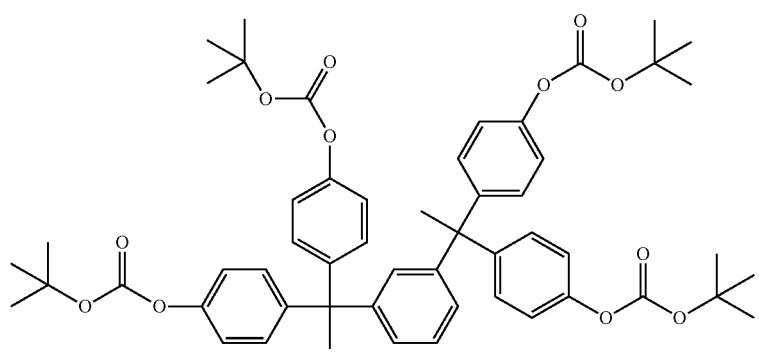

In still other embodiments, the thin film transistor comprises a dielectric layer, wherein the dielectric layer is formed by the crosslinking of: a crosslinking agent; and a molecular glass selected from the group consisting of 4,4'-(1,4-phenylenediisopropylidene)bisphenol, tetrakis(4-hydroxyphenyl)silane, tetrakis(3-hydroxyphenyl)silane, tetrakis(2-hydroxyphenyl)silane; tetrakis(4-hydroxybiphenyl)silane, tetrakis(3-[3-hydroxybiphenyl])silane, tetrakis(4-[3-hydroxybiphenyl])silane, tetrakis(3-[4-hydroxybiphenyl])silane, tetrakis(4-[4-hydroxybiphenyl])silane, tetrakis(3-methoxyphenyl)silane, tetrakis(4-methoxyphenyl)silane, tetrakis(3-[3-methoxybiphenyl])silane, tetrakis(4-[3-methoxybiphenyl])silane, tetrakis(3-[4-methoxybiphenyl])silane, tetrakis(4-[4-methoxybiphenyl])silane, tri(2-adamantyloxymethylcholate)-3-yl-adamantan-1,3,5-tricarboxylate, tri{[(2-methyl-2-adamantyl)oxy]carbonylmethylcholate}-3-yl-adamantan-1,3,5-tricarboxylate, adamantane-1,3,5-triyltris(oxymethylene) tricholate, adamantane-1,3,5-triyltris(oxymethylene)-tri-3-(2-adamantyloxymethoxy)cholate, tri(2-methyl-2-adamantyl)-adamantan-1,3,5-tricarboxylate, 1,3,4-tris[(2-adamantyloxymethylcholate)-3-oxymethyloxy]adamantane, 1,2,3,4,6-penta-O-(2-adamanthyloxymethyl)-alpha-D-glucose, and 1,2,3,4,6-penta-O-{[(2-methyl-2-adamantyl)oxy]carbonylmethyl}-alpha-D-glucose.

Also disclosed is a dielectric layer comprising an amorphous molecular material. Further disclosed is an electronic device comprising a dielectric layer, wherein the dielectric layer comprises an amorphous molecular material, as well as processes and compositions for producing such dielectric layers and devices comprising the same.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
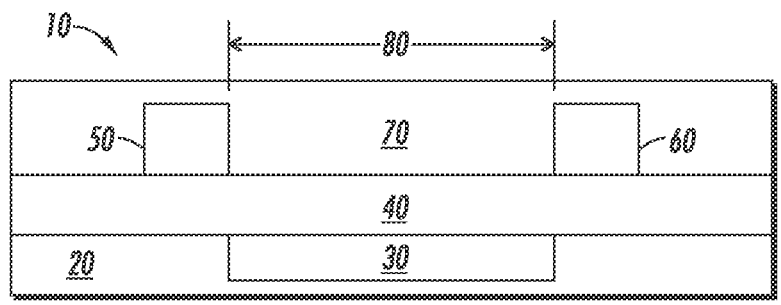
FIG. 1 represents a first embodiment of a TFT according to the present disclosure.

The present disclosure relates to various embodiments of dielectric layers, as well as processes and compositions for producing the same. The dielectric layers can be used in electronic devices such as thin film transistors.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

FIG. 1 illustrates a bottom-gate bottom-contact TFT configuration according to the present disclosure. The TFT 10 comprises a substrate 20 in contact with the gate electrode 30 and a gate dielectric layer 40. Although here the gate electrode 30 is depicted within the substrate 20, this is not required. However, it is important that the gate dielectric layer 40 separates the gate electrode 30 from the source electrode 50, drain electrode 60, and the semiconducting layer 70. The semiconducting layer 70 runs over and between the source and drain electrodes 50 and 60. The semiconductor has a channel length 80 between the source and drain electrodes 50 and 60.

Figure 2:
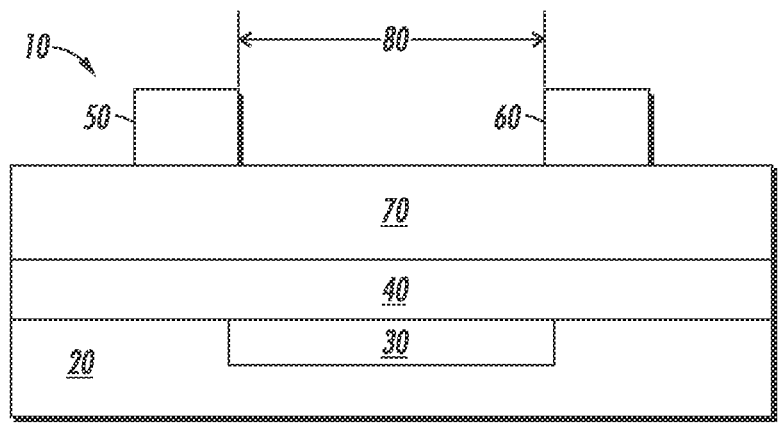
FIG. 2 represents a second embodiment of a TFT according to the present disclosure.

FIG. 2 illustrates another bottom-gate top-contact TFT configuration according to the present disclosure. The TFT 10 comprises a substrate 20 in contact with the gate electrode 30 and a gate dielectric layer 40. The semiconducting layer 70 is placed on top of the gate dielectric layer 40 and separates it from the source and drain electrodes 50 and 60.

Figure 3:
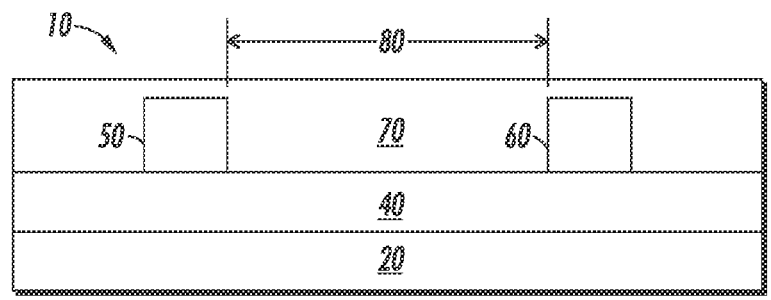
FIG. 3 represents a third embodiment of a TFT according to the present disclosure.

FIG. 3 illustrates a bottom-gate bottom-contact TFT configuration according to the present disclosure. The TFT 10 comprises a substrate 20 which also acts as the gate electrode and is in contact with a gate dielectric layer 40. The source electrode 50, drain electrode 60, and semiconducting layer 70 are located atop the gate dielectric layer 50.

Figure 4:
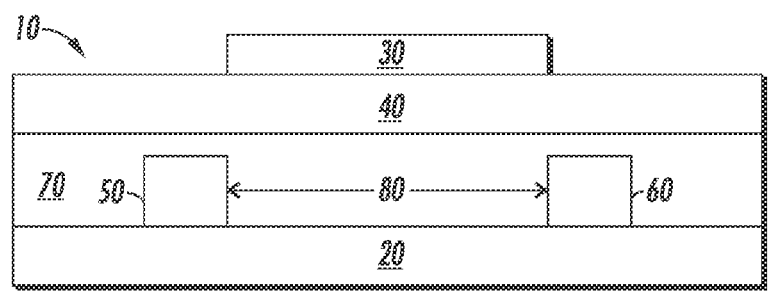
FIG. 4 represents a fourth embodiment of a TFT according to the present disclosure.

FIG. 4 illustrates a top-gate top-contact TFT configuration according to the present disclosure. The TFT 10 comprises a substrate 20 in contact with the source electrode 50, drain electrode 60, and the semiconducting layer 70. The semiconducting layer 70 runs over and between the source and drain electrodes 50 and 60. The gate dielectric layer 40 is on top of the semiconducting layer 70. The gate electrode 30 is on top of the gate dielectric layer 40 and does not contact the semiconducting layer 70.

The gate dielectric layer of the present disclosure comprises an amorphous molecular material, also known as a molecular glass. In some embodiments, the molecular glass is not crosslinked, for example in a top-gate TFT. In other embodiments, the molecular glass is crosslinked to form a matrix or network for the gate dielectric layer. In further embodiments, a crosslinking agent is used together with the molecular glass to form a matrix or network comprising both the molecular glass and the crosslinking agent for the gate dielectric layer. In other embodiments, the molecular glass is self-crosslinked to form a network for the gate dielectric layer. In other embodiments, a molecular glass is crosslinked with a different molecular glass to form a network for the gate dielectric layer. It is understood that the chemical structure of the molecular glass may change slightly after crosslinking due to the chemical reaction between the functional groups, and/or elimination of some small molecular component.

The disclosed molecular glasses or amorphous molecular materials are useful as electrically insulating materials for electronics, particularly as electrically insulating dielectric materials for thin-film transistor devices. Molecular glasses are amorphous molecular materials which show a glass transition temperature (preferably significantly higher than room temperature) rather than a melting point. Unlike other small molecules, the unique glass forming properties are due to an inability to crystallize. Therefore, the disclosed molecules can be trapped in a kinetically stable amorphous state. As a result, they are small molecules capable of forming amorphous films. A molecular glass can be characterized by the disorder in both intermolecular distance and/or orientation, and the presence of free volume, using for example X-ray diffraction techniques.

The disclosed amorphous molecular glass combines the beneficial aspects of small molecules along with many of the favorable aspects of polymers. Such amorphous molecular materials have a well-defined structure, unlike polymeric materials, and can be highly purified to be electronic grade, for example with purity greater than 95%, greater than 99%, or greater than 99.5%. In addition, amorphous molecular materials offer some benefits similar to polymeric materials, such as high thermal stability and the ability to form a thin film. The uniform distribution of functional groups in the amorphous molecular glass (and the crosslinking agent) allows for high crosslinking density in the gate dielectric layer. The small free volume (i.e. the volume of the matrix not occupied by the atoms in the matrix itself) of the matrix formed by the amorphous molecular material also allows for a higher breakdown voltage, particularly when formed as a thin film. In comparison, because a polymeric material is composed of many strands of different lengths and compositions, the free volume distribution varies, so that the lowest regional breakdown voltage in the overall layer determines the performance of the overall layer itself.

In embodiments, the molecular glass or the crosslinked network comprising the molecular glass is insulative. The conductivity of the molecular glass or the crosslinked dielectric layer is for example less than $10^{-10}$ S/cm, including less than $10^{-12}$ S/cm.

Any suitable amorphous molecular material can be used. When viewing the three dimensional structure of the molecule, the disclosed amorphous molecular materials may have linear (I), T-type (II), tripodal (III), or tetrahedral (IV) structures as shown below. The molecular shape defines molecular flexibility as well as packing ability. In specific embodiments, the amorphous molecular materials have the tripodal (III) or the tetrahedral structure (IV). The molecule itself may appear to have molecular symmetry such as axis symmetry (C2 and C3 symmetry and the like), plane of symmetry, or center of symmetry. However, in the dielectric layer (solid state), there is a lack of long range ordering, like glass.

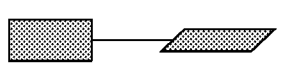

(I)

(II)

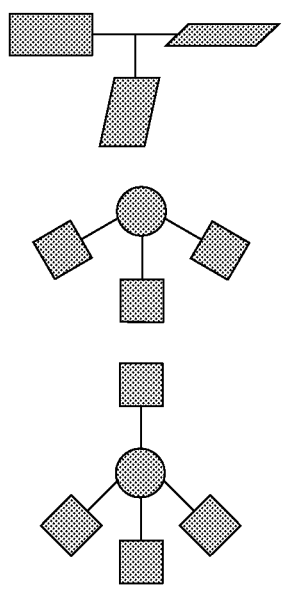

(III)

(IV)

The amorphous molecular materials may have functional groups such as —OH (hydroxyl), —NH$_2$ (amino), —CNO (isocyanate), —COON (carboxylic acid), —OR', —COOR', —OCOOR', epoxy, and the like, where R' is alkyl. These functional groups can be present on the rectangle and/or square moieties shown in the structures (I) to (IV). In view of the functional groups on the amorphous molecular materials, the amorphous molecular materials can be divided into, for example, phenolic molecular glass, amino molecular glass, carboxylic acid molecular glass, epoxy molecular glass, methoxy molecular glass, ester molecular glass, isocyanate molecular glass, etc.

In embodiments, the amorphous molecular materials can also be divided into different categories by the core component such as spiro based derivatives, bisphenol-A based derivatives, tetrahedral aryl silane based derivatives, adamantane based derivatives, cyclic or fused cyclic system based derivatives, triaryl amine based derivatives, and the like. In specific embodiments, the amorphous molecular material is a derivative of a spiro compound, such as a spirobisindane compound or a spirobi[chromane] compound. Each ring of the spiro compound has at least one functional group. In particular embodiments, the amorphous molecular material is the spirobisindane compound of Formula (1) or the spirobi[chromane] compound of Formula (2):

Formula (1)

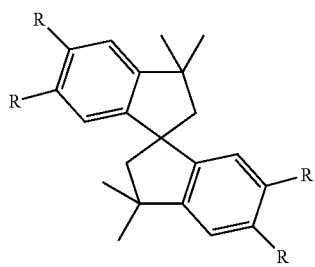

Formula (2)

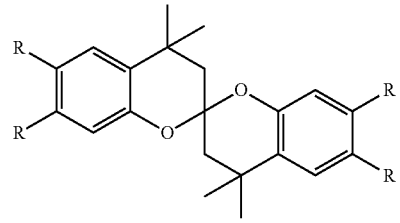

wherein each R substituent is independently selected from the group consisting of hydrogen, —OH, —NH$_2$, —OC$_2$H$_5$, —OCH$_3$, —OCOOC$_4$H$_9$, —CNO, —C$_6$H$_4$OH (hydroxyphenyl), —COOH, epoxy, and the like. In further embodiments, these particular compounds have more than one hydroxyl group or protected hydroxyl group (e.g. protected with a methoxy group, methoxycyclohexyl group, or the like) on each ring in the respective spiro compound. An exemplary compound of Formula (1) is 5,5',6,6'-tetrahydroxy-3,3,3',3'-tetramethyl-1,1'-spirobisindane (where R is hydroxyl). An exemplary compound of Formula (2) is 6,6',7,7'-tetrahydroxy-4,4,4',4'-tetramethyl-2,2'-spirobis[chromane] (where R is hydroxyl). These two exemplary compounds are illustrated as Formulas (1a) and (2a):

Formula (1a)

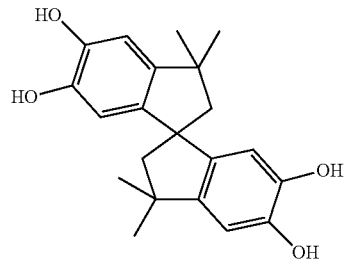

Formula (2a)

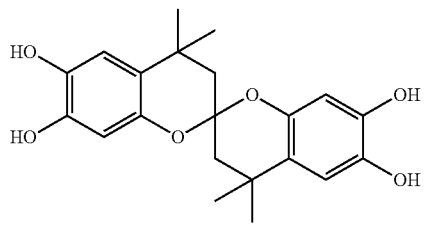

In other embodiments, the amorphous molecular material is a derivative of bisphenol-A. Exemplary derivatives include the compounds of Formula (3) to Formula (8):

Formula (3)

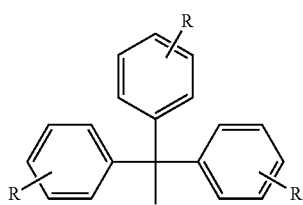

Formula (4)

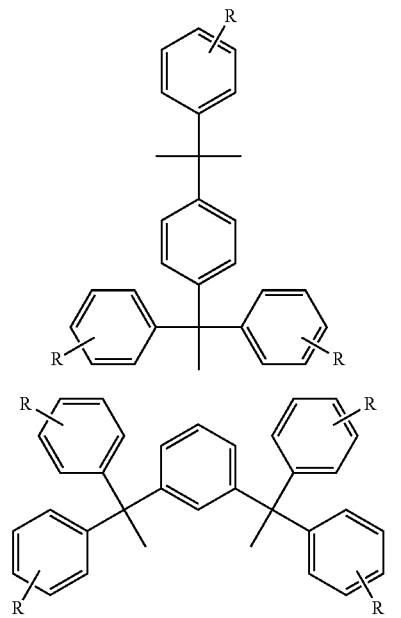

Formula (5)

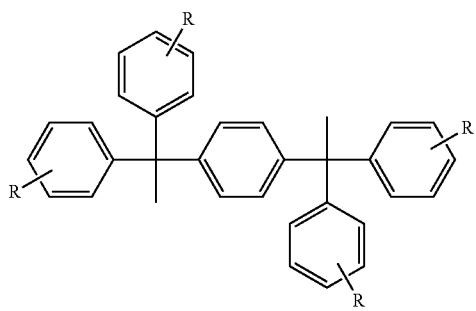

Formula (6)

Formula (7)

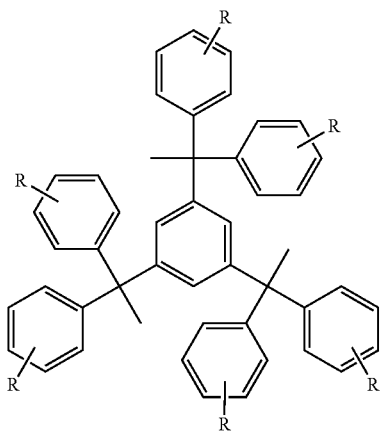

Formula (8)

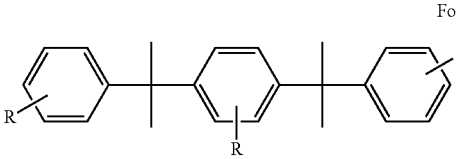

wherein each R is independently selected from the group consisting of hydrogen, —OH, —NH$_2$, —OCH$_3$, —OC$_2$H$_5$, —OCOOC$_4$H$_9$, —CNO, —C$_6$H$_4$OH (hydroxyphenyl), —COOH, epoxy group, and the like. In further embodiments, the R group is —OH or a protected —OH group such as OCH$_3$, OCOOC$_4$H$_9$, methoxycyclohexyl group, and the like. An exemplary compound of Formula (4) is a hydroxyphenyl derivative of 4,4'-(1,4-phenylenediisopropylidene) bisphenol. Other exemplary bisphenol-A based molecular glasses include structure (a) to structure (e):

(a)

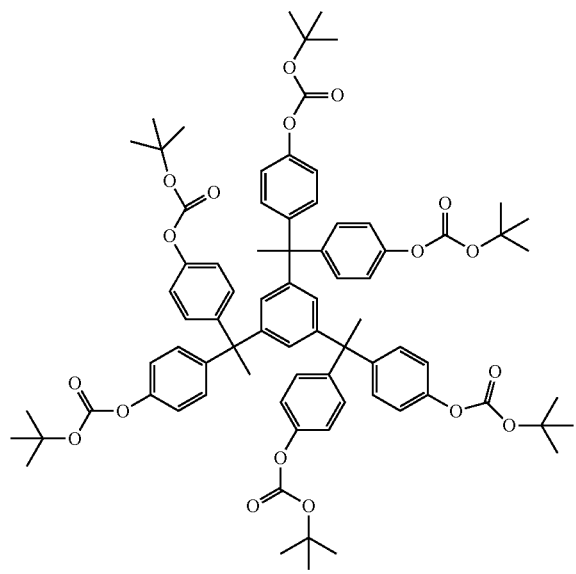

(b)

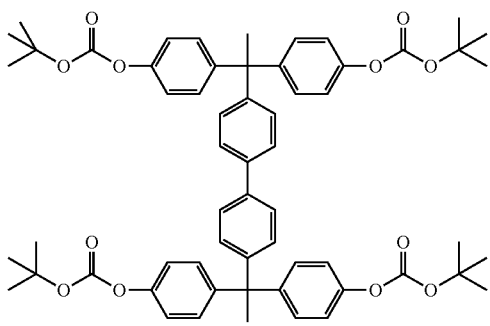

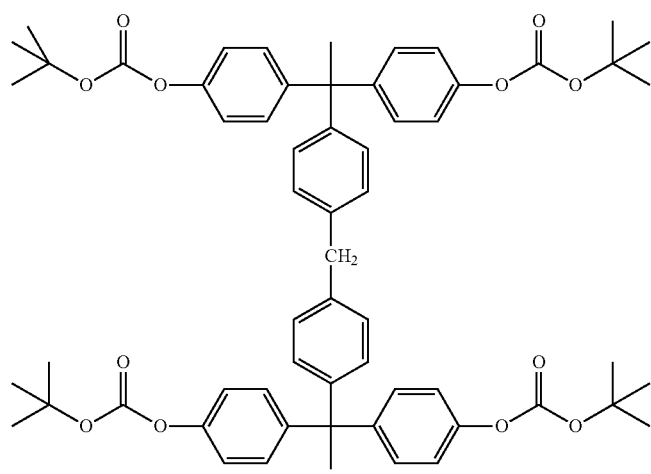
(c)
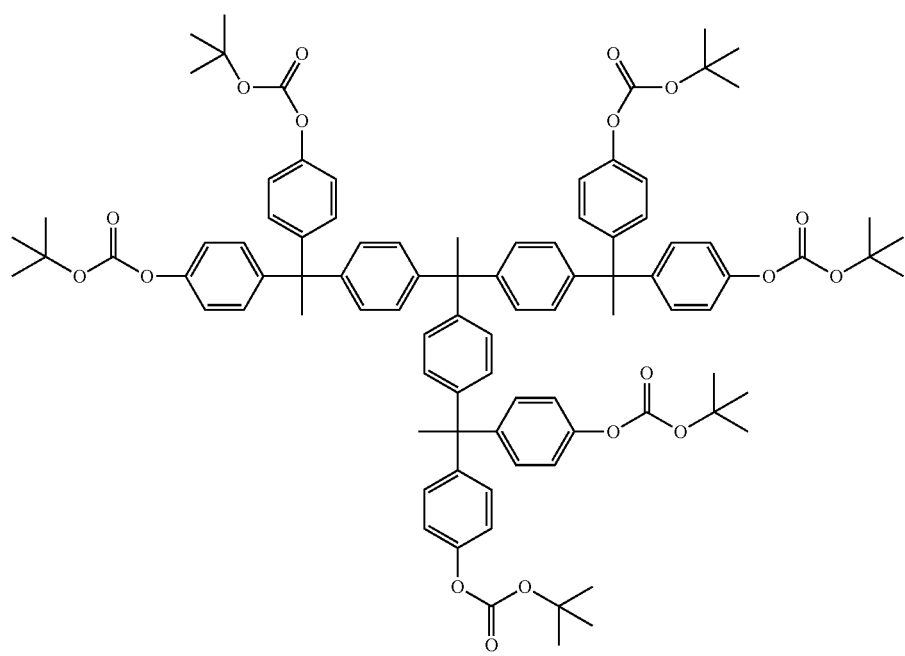
(d)
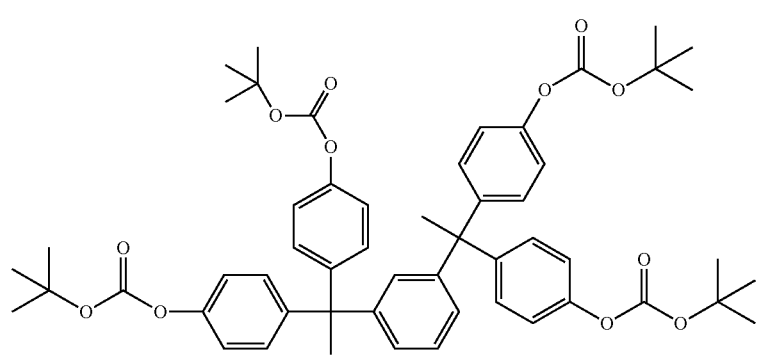
(e)

In other embodiments, the amorphous molecular material is a derivative of a tetrahedral silane of Formula (9):

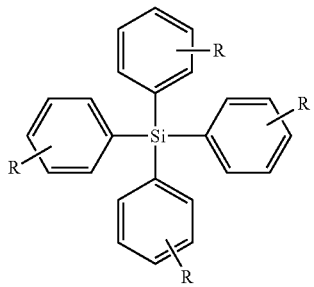

Formula (9)

wherein each R is independently selected from the group consisting of hydrogen, —OH, —NH$_2$, —OCH$_3$, —OC$_2$H$_5$, —OCOOC$_4$H$_9$, —CNO, —C$_6$H$_4$OH (hydroxyphenyl), —COON, epoxy group, and the like. Exemplary embodiments of Formula (9) include, for example, tetrakis(4-hydroxyphenyl)silane, tetrakis(3-hydroxyphenyl)silane, tetrakis(2-hydroxyphenyl)silane; tetrakis(4-hydroxybiphenyl)silane, tetrakis(3-[3-hydroxybiphenyl])silane, tetrakis(4-[3-hydroxybiphenyl])silane, tetrakis(3-[4-hydroxybiphenyl])silane, tetrakis(4-[4-hydroxybiphenyl])silane, tetrakis(3-methoxyphenyl)silane, tetrakis(4-methoxyphenyl)silane, tetrakis(3-[3-methoxybiphenyl])silane, tetrakis(4-[3-methoxybiphenyl])silane, tetrakis(3-[4-methoxybiphenyl])silane, tetrakis(4-[4-methoxybiphenyl])silane, and mixtures thereof.

In other embodiments, the amorphous molecular material may be an adamantane based molecular glass of Formula (10):

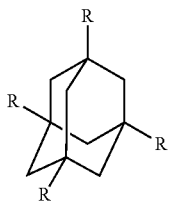

Formula (10)

wherein each R is independently hydrogen or a substituent comprising a heteroatom such as oxygen and nitrogen. In further embodiments, R is a group containing acetal and/or ester moieties, e.g. glucose. In other embodiments, R includes one or more cholic acid groups. Exemplary R groups include, for example, structure (f) to structure (h):

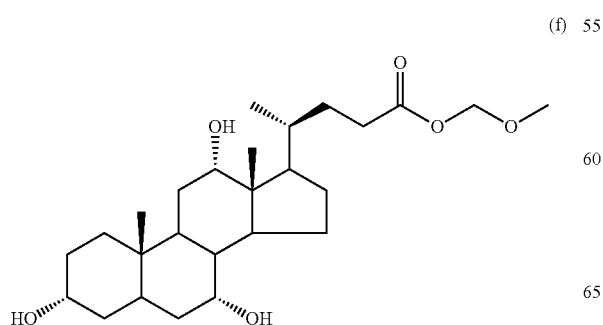

(f)

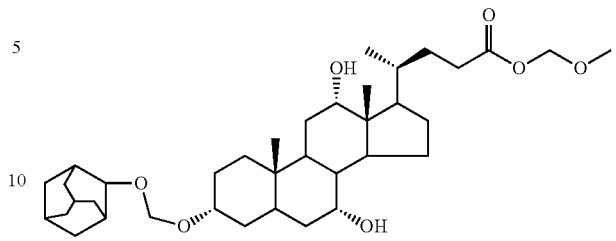

(g)

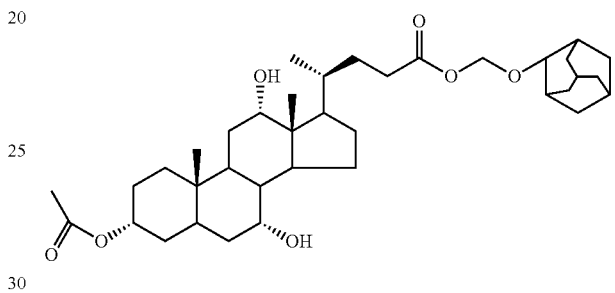

(h)

Exemplary adamantane based molecular glasses include tri(2-adamantyloxymethyl cholate)-3-yl-adamantan-1,3,5-tricarboxylate, tri{[(2-methyl-2-adamantyl)oxy]carbonylmethylcholate}-3-yl-adamantan-1,3,5-tricarboxylate, adamantane-1,3,5-triyltris(oxymethylene)tricholate, adamantane-1,3,5-triyltris(oxymethylene)-tri-3-(2-adamantyloxymethoxy)cholate, tri(2-methyl-2-adamantyl) adamantan-1,3,5-tricarboxylate, 1,3,4-tri[(2-adamantyloxymethylcholate)-3-oxymethyloxy]adamantane, 1,2,3,4,6-penta-O-(2-adamanthyloxymethyl)-alpha-D-glucose, 1,2,3,4,6-penta-O-{[(2-methyl-2-adamantyl)oxy]carbonylmethyl}-alpha-D-glucose, and the like.

In other embodiments, the amorphous molecular materials are cyclic or fused cyclic system based derivatives. The cyclic or fused cyclic core can be, for example, benzene, hexaphenybenzene, triphenylbenzene, naphthalene, anthracene, phenanthracene, pyrene, and the like. Exemplary molecular glasses having cyclic or fused cyclic systems include those of Formula (11) to Formula (14):

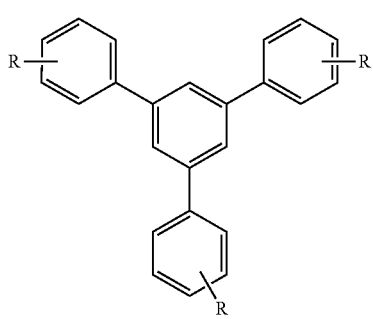

Formula (11)

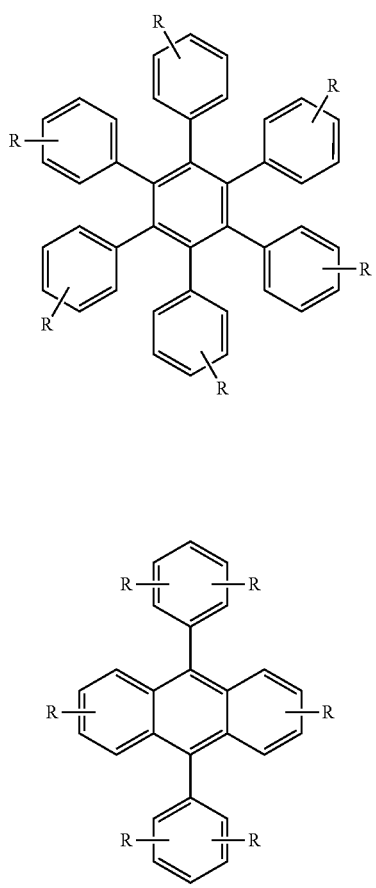

Formula (12)

Formula (13)

Formula (14)

wherein each R is independently selected from the group consisting of hydrogen, —OH, —NH$_2$, —OCH$_3$, —OC$_2$H$_5$, —OCOOC$_4$H$_9$, —CNO, —C$_6$H$_4$OH (hydroxyphenyl), —COOH, epoxy group, and the like; and R$_1$ is a phenyl group substituted with an oxygen-containing radical, exemplary R$_1$ groups being for example hydroxyphenyl, methoxyphenyl, butoxycarbonyloxybenzyl group, and the like. In further embodiments, the R group is independently —OH or protected —OH group such as OCH$_3$, OCOOC$_4$H$_9$, methoxycyclohexyl group, and the like.

In some embodiments, the amorphous molecular materials are triaryl amine derivatives of the following Formula (15) to Formula (17):

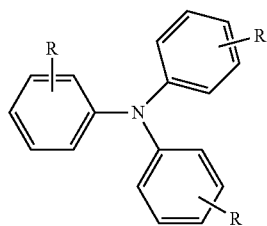

Formula (15)

Formula (16)

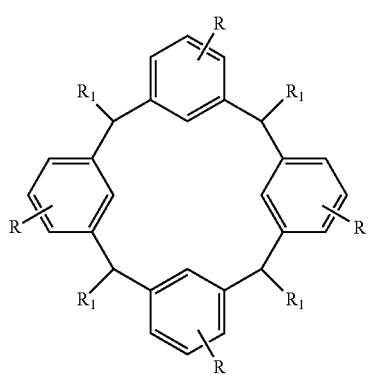

Formula (17)

wherein each R is independently selected from the group consisting of hydrogen, —OH, —NH$_2$, —OCH$_3$, —OC$_2$H$_5$, —OCOOC$_4$H$_9$, —CNO, —C$_6$H$_4$OH (hydroxyphenyl), —COOH, methoxyphenyl, butoxycarbonyloxybenzyl, epoxy group, and the like.

The amorphous molecular material may have a molecular weight of about 200 to about 5000, including from about 250 to about 3000. This is much lower than the molecular weight (Mw) of typical polymeric materials. It should be noted that the molecular weight of a polymeric material is the average value for polymer chains of different lengths, whereas for molecular glasses, all molecules have the same molecular weight.

In embodiments, the molecular glass may have a glass transition temperature from about room temperature (25 degrees C.) to about 350 degrees C., including from about 50 to about 200 degrees C. After crosslinking, the molecular glass network may or may not have glass transition temperature.

In some embodiments, the amorphous molecular materials are not crosslinked. In other embodiments, the amorphous molecular materials are crosslinked to offer a robust layer. The functional groups disclosed above (such as —OH, —NH$_2$, —OCH$_3$, —OC$_2$H$_5$, —OCOOC$_4$H$_9$, —CNO, —C$_6$H$_4$OH (hydroxyphenyl), —COON, methoxyphenyl, butoxycarbonyloxybenzyl, epoxy group) allow the amorphous molecular material to be crosslinked, photochemically or using crosslinking agents, in the gate dielectric layer to form a matrix. The amorphous molecular material can be crosslinked by itself or crosslinked with another amorphous molecular material to form network or matrix of the dielectric layer. The matrix may also comprise a crosslinking agent which is crosslinked with the amorphous molecular material.

Generally speaking, the crosslinking agent has at least two crosslinking groups, such as amino, hydroxyl, alkoxy, etc., which are capable of reacting with the functional groups on the amorphous molecular material to form a crosslinked network or matrix comprising the crosslinking agent or part of the crosslinking agent. Exemplary crosslinking agents include a melamine-formaldehyde resin, a phenol-formaldehyde resin, and 1,3,4,6-tetrakis(methoxylmethyl)glycoluril. An idealized melamine-formaldehyde resin is shown as Formula (18) and 1,3,4,6-tetrakis(methoxylmethyl)glycoluril is shown as Formula (19). Other crosslinking agents, such as compounds comprising at least two isocyanate groups, amine groups, carboxylic acid groups, and the like, can be used.

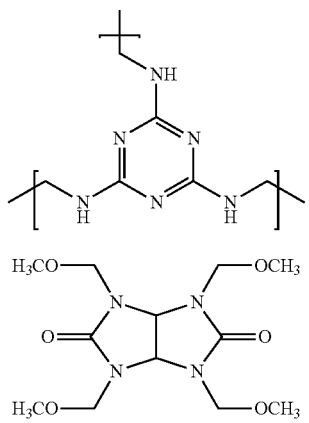

Formula (18)

Formula (19)

Generally, the molar ratio of amorphous molecular material to crosslinking agent is calculated so that all of the crosslinking groups in the amorphous molecular material and the crosslinking agents are reacted, to obtain as high a crosslinking density as possible. For example, if the amorphous molecular material has four hydroxyl groups and the crosslinking agent has four crosslinking groups, then the molar ratio of amorphous molecular material to crosslinking agent may be 1:1. As another example, if the amorphous molecular material has four hydroxyl groups and the crosslinking agent has three crosslinking groups, then the molar ratio of amorphous molecular material to crosslinking agent may be be 3:4.

The gate dielectric layer may be formed using conventional processes known in the art. In embodiments, the gate dielectric layer is formed using liquid depositing techniques. Any suitable liquid depositing technique may be employed. Exemplary liquid depositing techniques include blanket coating such as spin coating, blade coating, rod coating, dip coating, and the like, and printing such as screen printing, ink jet printing, stamping, stencil printing, screen printing, gravure printing, flexography printing, and the like.

In particular, the liquid composition used to form the gate dielectric layer may comprise the amorphous molecular material, an optional crosslinking agent, and an optional catalyst. The optional catalyst may be an acid. Exemplary acid catalysts include toluene sulfonic acid (TSA). When a photoacid generator, i.e. a compound that generates acid upon light irradiation, is used as the acid catalyst, the gate dielectric layer can be patterned into the desired structure. Exemplary photoacid generators may include bis(4-tert-butylphenyl)iodonium perfluoro-1-butanesulfonate, bis(4-tert-butylphenyl) iodonium p-toluenesulfonate, boc-methoxyphenyldiphenyl-sulfonium triflate, diphenyliodonium 9,10-dimethoxyanthrancene-2-sulfonate, diphenyliodonium p-toluenesulfonate, diphenyliodonium triflate, N-hydronaphthalimide triflate, (4-iodophenyl)diphenylsulfonium triflate, (4-methylphenyl)diphenylsulfonium triflate, tris(4-tert-butylphenyl)sulfonium triflate, triarylsulfonium hexafluorophosphate salts, and the like. The optional catalyst may also be a base. Exemplary base catalysts include organoamines such as triethylamine, phosphanes, carbonyl, nitrosyl, N-heterocyclic carbine ligands, imidazolidinone and pyrrolidine derivatives, and the like.

Exemplary solvents used in the solution may include alcohols such as propanol, butanol, hexanol, heptanol, octanol, nonanol, decanol, undecanol, dodecanol, tetradecanol, and hexadecanol; a diol such as hexanediol, heptanediol, octanediol, nonanediol, and decanediol; an alcohol comprising an unsaturated double bond, such as farnesol, dedecadienol, linalool, geraniol, nerol, heptadienol, tetradecenol, hexadeceneol, phytol, oleyl alcohol, dedecenol, decenol, undecylenyl alcohol, nonenol, citronellol, octenol, and heptenol; a cycloaliphatic alcohol with or without an unsaturated double bond, such as methylcyclohexanol, menthol, dimethylcyclohexanol, methylcyclohexenol, terpineol, dihydrocarveol, isopulegol, cresol, trimethylcyclohexenol; and the like; and mixtures and isomers thereof; hydrocarbons or aromatic hydrocarbons such as hexane, heptane, toluene, xylene, mesitylene, trimethyl benzene, ethyl benzene, and the like, chlorinated solvents such as chlorobenzene, chlorotoluene, dichlorobenzene, dichloroethane, and the like; ketones such as acetone, methyl ethyl ketone, methy isobutyl ketone, and the like; acetates, such as propylene glycol monoethyl ether acetate, ethyl acetate, and the like; pyridine, tetrahydrofuran, and the like. The molecular glass may have a concentration of from about 2 percent by weight to about 60 percent by weight, including from about 5 percent by weight to about 30 percent by weight, or from about 8 percent by weight to about 20 percent by weight in the solution. The liquid composition may have a viscosity of for example from about 2 cps to about 1000 cps, including from about 5 cps to about 500 cps. In further embodiment, the liquid composition is inkjettable, having a viscosity from about 2 cps to about 20 cps including from about 5 cps to 12 cps. In embodiments, the liquid composition is a Newtonian fluid. In other embodiments, the liquid composition is a non-Newtonian fluid. The liquid composition has a surface tension for suitable coating and printing techniques. For example, in some embodiments, the liquid composition has a surface tension of from about 22 mN/m to about 38 mN/m, including from about 25 mN/m to about 32 mN/m.

In further embodiments, the liquid composition can further comprise inorganic particles such as nanoparticles. In embodiments, the inorganic nanoparticles have a particle size of from about 1 nm to about 300 nm, including from about 1 nm to about 100 nm, and from about 1 nm to about 50 nm. Exemplary nanoparticles include metal nanoparticles such as Au, Ag, Cu, Cr, Ni, Pt and Pd; metal oxide nanoparticles such as $Al_2O_3$, $TiO_2$, $ZrO_2$, $La_2O_3$, $Y_2O_3$, $Ta_2O_5$, $ZrSiO_4$, SrO, SiO, $SiO_2$, MgO, CaO, $HfSiO_4$, $BaTiO_3$, and $HfO_2$; and other inorganic nanoparticles such as ZnS and $Si_3N_4$. The addition of inorganic nanoparticles has several advantages. First, the dielectric constant of the overall dielectric layer can be improved. Second, when metal nanoparticles are added, the particles can function as electron traps to lower gate leakage of the gate dielectric layer. The inorganic nanoparticles can be from about 0.1% to about 50% or from about 1% to about 20% by weight of the molecular glass.

The liquid composition can further comprise interfacial materials such as silanes, polysiloxanes, polysilsesquioxanes, and the like.

The total thickness of the gate dielectric layer may be, for example, from about 5 nanometers to about 5 microns, including from about 100 nanometers to about 1 micron. In particular embodiments, the gate dielectric layer has a thickness of 2 microns or less, including from about 100 to about 500 nanometers.

The substrate may be composed of materials including but not limited to silicon, glass plate, plastic film or sheet. For structurally flexible devices, plastic substrate, such as for example polyester, polycarbonate, polyimide sheets and the like may be preferred. The thickness of the substrate may be from about 10 micrometers to over 10 millimeters with an exemplary thickness being from about 50 to about 100 micrometers, especially for a flexible plastic substrate and from about 0.5 to about 10 millimeters for a rigid substrate such as glass or silicon.

The gate electrode is composed of an electrically conductive material. It can be a thin metal film, a conducting polymer film, a conducting film made from conducting ink or paste, or the substrate itself, for example heavily doped silicon. Examples of gate electrode materials include but are not restricted to aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges for example from about 10 to about 200 nanometers for metal films and from about 1 to about 10 micrometers for conductive polymers. Typical materials suitable for use as source and drain electrodes include those of the gate electrode materials such as aluminum, gold, silver, chromium, zinc, indium, conductive metal oxides such as zinc-gallium oxide, indium tin oxide, indium-antimony oxide, conducting polymers and conducting inks. Typical thicknesses of source and drain electrodes are, for example, from about 40 nanometers to about 1 micrometer, including more specific thicknesses of from about 100 to about 400 nanometers.

The semiconducting layer of the present disclosure comprises an organic semiconductor. Regarding electrical performance characteristics, the organic semiconductor usually has a conductivity in the range of $10^{-8}$ to $10^{-4}$ S/cm, preferably from $10^{-7}$ to $10^{-5}$ S/cm. Various dopants known in the art may also be added to change the conductivity. The organic semiconductor can be either a p-type or n-type semiconductor. Examples of organic semiconductors include but are not limited to acenes, such as anthracene, tetracene, pentacene, and substituted pentacenes, perylenes, fullerenes, oligothiophenes, polythiophenes and their substituted derivatives, polypyrrole, poly-p-phenylenes, poly-p-phenylvinylidenes, naphthalenedicarboxylic dianhydrides, naphthalene-bisimides, polynaphthalenes, phthalocyanines such as copper phthalocyanines or zinc phthalocyanines and their substituted derivatives.

In specific embodiments, the organic semiconductors are polythiophenes. Polythiophenes include, for example, regioregular and regiorandom poly(3-alkylthiophene)s, polythiophenes comprising substituted and unsubstituted thienylene groups, polythiophenes comprising optionally substituted thieno[3,2-b]thiophene and/or optionally substituted thieno[2,3-b]thiophene groups, polythiophenes comprising fused-ring aromatic groups, polythiophenes comprising heteroatom-containing fused-ring aromatic groups, and polythiophenes comprising non-thiophene based aromatic groups such as phenylene, fluorene, furan, and the like.

In specific embodiments, the polythiophene semiconductor has the following general structure of Formula (20):

Formula (20)

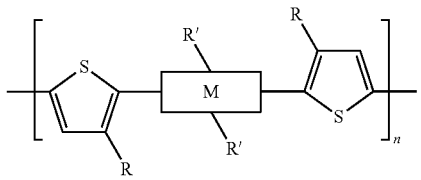

where R and R' are independently selected from hydrogen, halogen, alkyl, alkoxyalkyl, siloxyalkyl, and perfluoroalkyl; M is a divalent linkage; and n is the number of repeat units. In specific embodiments, M is thienylene, substituted thienylene, bithiophene, terthiophene, arylene, substituted arylene, heteroarylene, or substituted heteroarylene. In more specific embodiments, M is phenylene, thienothiophene, benzothiophene, carbazole, indolocarbazole, fluorene, benzodithiophene, or bithiophene. In other specific embodiments, R and R' are selected from alkyl. In more specific embodiments, R and R' are alkyl containing from about 1 to about 25 carbon atoms, including from about 4 to about 18 carbon atoms, and further including from about 6 to about 16 carbon atoms, including isomeric forms thereof, mixtures thereof, and the like.

The semiconducting layer is from about 5 nanometers to about 1000 nanometers deep, including from about 20 to about 100 nanometers in depth. In certain configurations, such as the configurations shown in FIGS. 1 and 4, the semiconducting layer completely covers the source and drain electrodes.

The semiconducting layer can be formed by molecular beam deposition, vacuum evaporation, sublimation, spin-on coating, dip coating, printing (e.g., inkjet printing, screen printing, stencil printing, microcontact printing, flexographic printing), and other conventional processes known in the art, including those processes described in forming the gate electrode.

The various components of the OTFT may be deposited upon the substrate in any order. Generally, however, the gate electrode and the semiconducting layer should both be in contact with the gate dielectric layer. In addition, the source and drain electrodes should both be in contact with the semiconducting layer. The resulting TFT has good mobility and good current on/off ratio.

The following examples are for purposes of further illustrating the present disclosure. The examples are merely illustrative and are not intended to limit devices made in accordance with the disclosure to the materials, conditions, or process parameters set forth therein. All parts are percentages by volume unless otherwise indicated.

EXAMPLES

Example 1

5,5',6,6'-Tetrahydroxy-3,3,3',3' tetramethyl-1,1'-spirobisindane was purchased from Alfa Aesar. The spiro compound was dissolved in propylene glycol methyl ether acetate at a 12 wt % loading, together with 6 wt % melamine-formaldehyde resin as crosslinking agent, and a small amount of toluene sulfonic acid as the acid catalyst. The solution was filtered with a 0.2 micron syringe filter and spin-coated at 1000 rpm on a glass slide. The film (~200 nm thick) was baked at 120° C. for 30 minutes. The resulting film was very uniform and robust, and was resistant to most solvents, including dichlorobenzene.

Example 2

4,4'-(1,4-phenylenediisopropylidene) bisphenol was used in this example. This molecular glass was dissolved in propylene glycol methyl ether acetate at a 12 wt % loading, together with 6 wt % melamine-formaldehyde resin as crosslinking agent, and a small amount of toluene sulfonic acid as the acid catalyst. The solution was filtered with a 0.2 micron syringe filter and spin-coated at 1000 rpm on a glass slide. The film (~200 nm thick) was baked at 120° C. for 30 minutes. The resulting film was very uniform and robust, and was resistant to most solvents, including dichlorobenzene.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A thin film transistor comprising a dielectric layer, a gate electrode, a source electrode, and a drain electrode;
   wherein the dielectric layer separates the gate electrode from the source electrode and the drain electrode; and
   wherein the dielectric layer comprises a molecular glass.

2. The thin film transistor of claim 1, wherein the molecular glass has a linear, T-type, tripodal, or tetrahedral structure.

3. The thin film transistor of claim 2, wherein the molecular glass comprises one or more functional groups selected from the group consisting of hydroxyl, amino, isocyanate, carboxylic acid, ester, alkoxy, and epoxy functional groups.

4. The thin film transistor of claim 1, wherein the molecular glass is selected from the group consisting of phenolic molecular glass, amino molecular glass, carboxylic acid molecular glass, epoxy molecular glass, methoxy molecular glass, ester molecular glass, and isocyanate molecular glass.

5. The thin film transistor of claim 1, wherein the molecular glass is a derivative of a compound selected from the group consisting of a spiro compound, a bisphenol-A compound, a tetrahedral aryl silane compound, an adamantane compound, a cyclic compound, and a triaryl amine compound.

6. The thin film transistor of claim 1, wherein the molecular glass has a glass transition temperature of from about 25 degrees C. to about 350 degrees C.

7. The thin film transistor of claim 1, wherein the molecular glass has a molecular weight of from about 200 to about 5000.

8. The thin film transistor of claim 1, wherein the molecular glass is further crosslinked with itself or with a crosslinking agent.

9. The thin film transistor of claim 8, wherein the crosslinking agent is 1,3,4,6-tetrakis(methoxylmethyl)glycoluril, a melamine-formaldehyde resin, or a phenol-formaldehyde resin.

10. The thin film transistor of claim 1, wherein the molecular glass comprises a bisphenol-A derivative selected from one of Formula (3) to Formula (8):

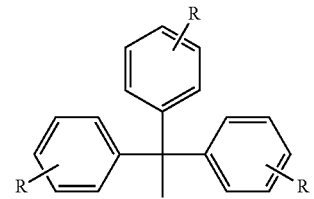

Formula (3)

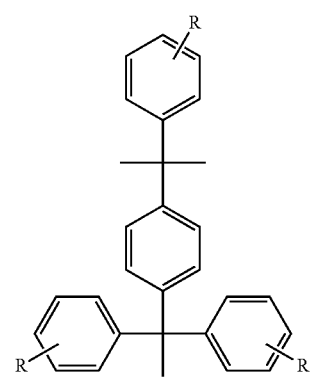

Formula (4)

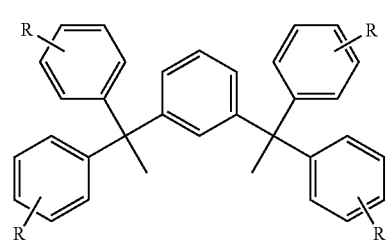

Formula (5)

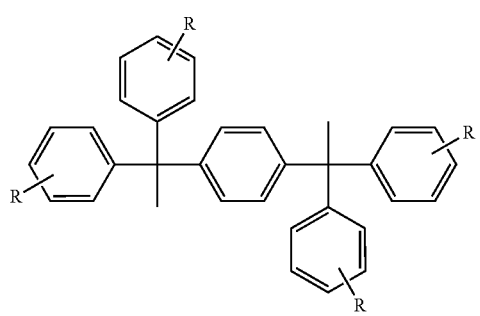

Formula (6)

Formula (7)

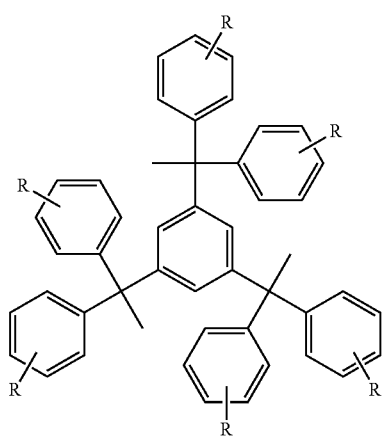

Formula (8)

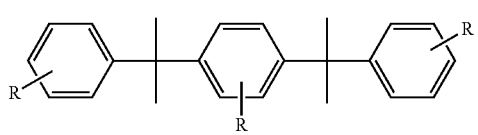

wherein each R is independently selected from the group consisting of hydrogen, hydroxyl, protected hydroxyl, amino, —OC$_2$H$_5$, —OCH$_3$, —OCOOC$_4$H$_9$, —CNO, hydroxyphenyl, —COON, and epoxy.

11. The thin film transistor of claim 1, wherein the molecular glass comprises a tetrahedral silane of Formula (9):

Formula (9)

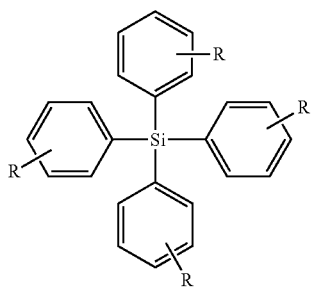

wherein each R is independently selected from the group consisting of hydrogen, hydroxyl, protected hydroxyl, amino, —OC$_2$H$_5$, —OCH$_3$, —OCOOC$_4$H$_9$, —CNO, hydroxyphenyl, —COON, and epoxy.

12. The thin film transistor of claim 1, wherein the molecular glass comprises an adamantane of Formula (10):

Formula (10)

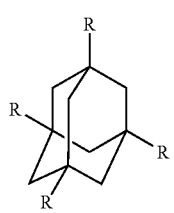

wherein each R is independently hydrogen or a substituent comprising a heteroatom.

13. The thin film transistor of claim 1, wherein the molecular glass comprises a cyclic system selected from one of Formula (11) to Formula (14):

Formula (11)

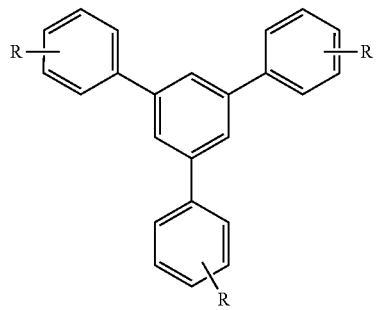

Formula (12)

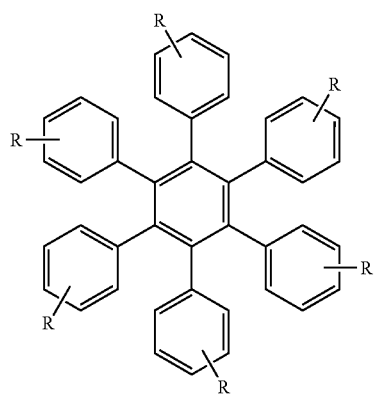

Formula (13)

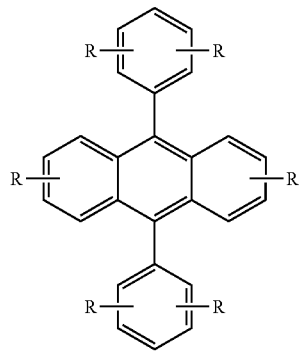

Formula (14)

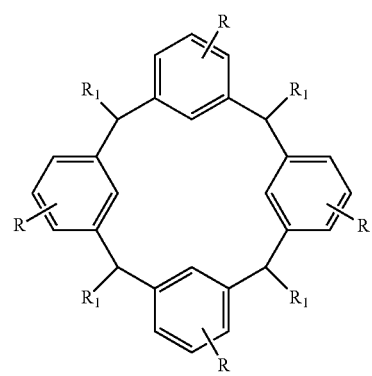

wherein each R is independently selected from the group consisting of hydrogen, hydroxyl, protected hydroxyl, amino, —OC$_2$H$_5$, —OCH$_3$, —OCOOC$_4$H$_9$, —CNO, hydroxyphenyl, —COOH, and epoxy; and $R_1$ is a phenyl group substituted with an oxygen-containing radical.

14. The thin film transistor of claim 1, wherein the molecular glass comprises a triarylamine derivative selected from one of Formula (15) to Formula (17):

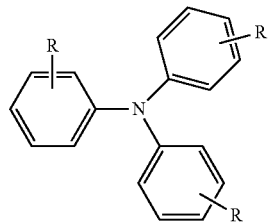

Formula (15)

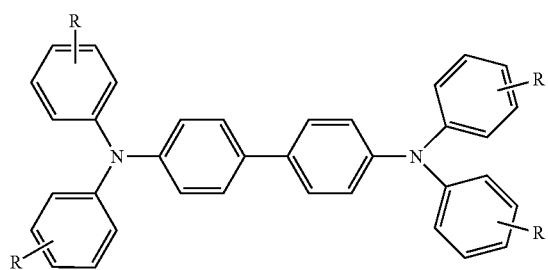

Formula (16)

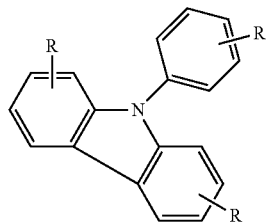

Formula (17)

wherein each R is independently selected from the group consisting of hydrogen, hydroxyl, protected hydroxyl, amino, -OC$_2$H$_5$, —OCH$_3$, —OCOOC$_4$H$_9$, —CNO, hydroxyphenyl, —COOH, and epoxy.

15. The thin film transistor of claim 1, wherein the molecular glass is selected from the group consisting of 4,4'-(1,4-phenylenediisopropylidene)bisphenol, tetrakis(4-hydroxyphenyl)silane, tetrakis(3-hydroxyphenyl)silane, tetrakis(2-hydroxyphenyl)silane; tetrakis(4-hydroxybiphenyl)silane, tetrakis(3-[3-hydroxybiphenyl])silane, tetrakis(4-[3-hydroxybiphenyl])silane, tetrakis(3-[4-hydroxybiphenyl])silane, tetrakis(4-[4-hydroxybiphenyl])silane, tetrakis(3-methoxyphenyl)silane, tetrakis(4-methoxyphenyl)silane, tetrakis(3-[3-methoxybiphenyl])silane, tetrakis(4-[3-methoxybiphenyl])silane, tetrakis(3-[4-methoxybiphenyl])silane, tetrakis(4-[4-methoxybiphenyl])silane, tri(2-adamantyloxymethyl cholate)-3-yl adamantan-1,3,5-tricarboxylate, tri{[(2-methyl-2-adamantyl)oxy]carbonylmethylcholate}-3-yl-adamantan -1,3,5-tricarboxylate, adamantane-1,3,5-triyltris(oxymethylene) tricholate, adamantane -1,3,5-triyltris(oxymethylene) tri-3-(2-adamantyloxymethoxy)cholate, tri(2-methyl-2-adamantyl) adamantan-1,3,5-tricarboxylate, 1,3,4-tri[(2-adamantyloxymethyl cholate)-3-oxymethyloxy]adamantane, 1,2,3,4,6-penta-O-(2-adamanthyloxymethyl)-alpha-D -glucose, 1,2,3,4,6-penta-O-{[(2-methyl-2-adamantyl)oxy]carbonylmethyl}-alpha-D -glucose, and structures (a) through (e):

(a)

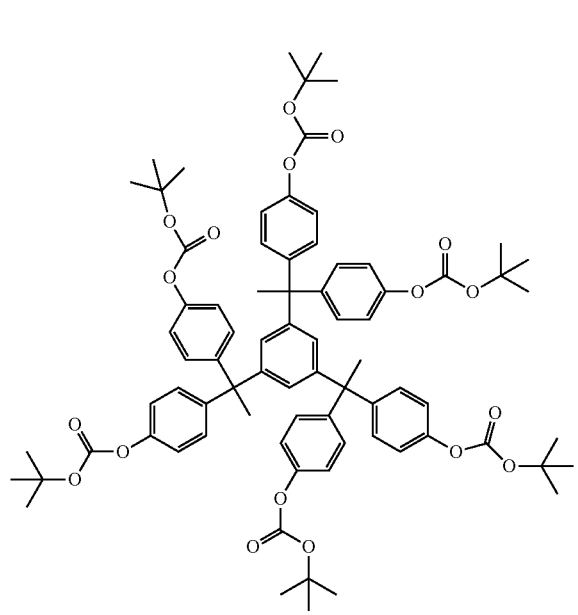

(b)

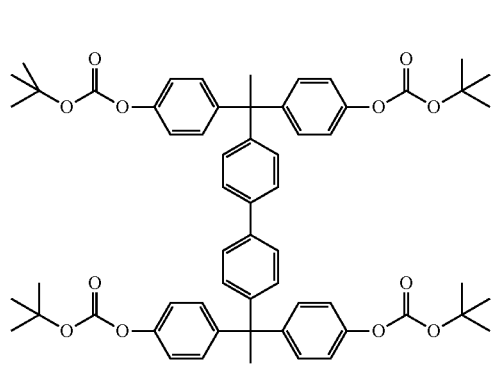

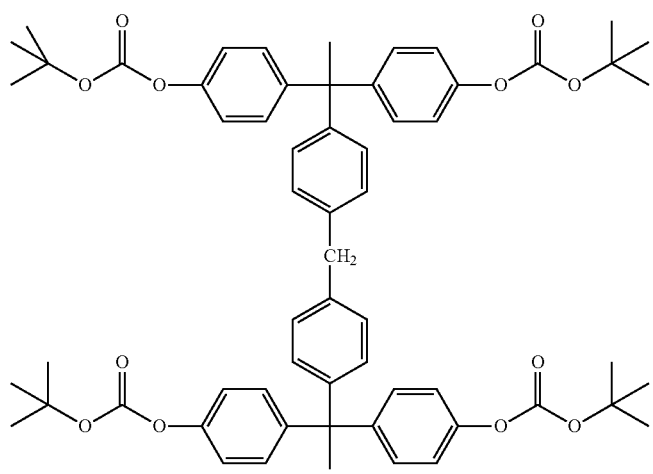
(c)
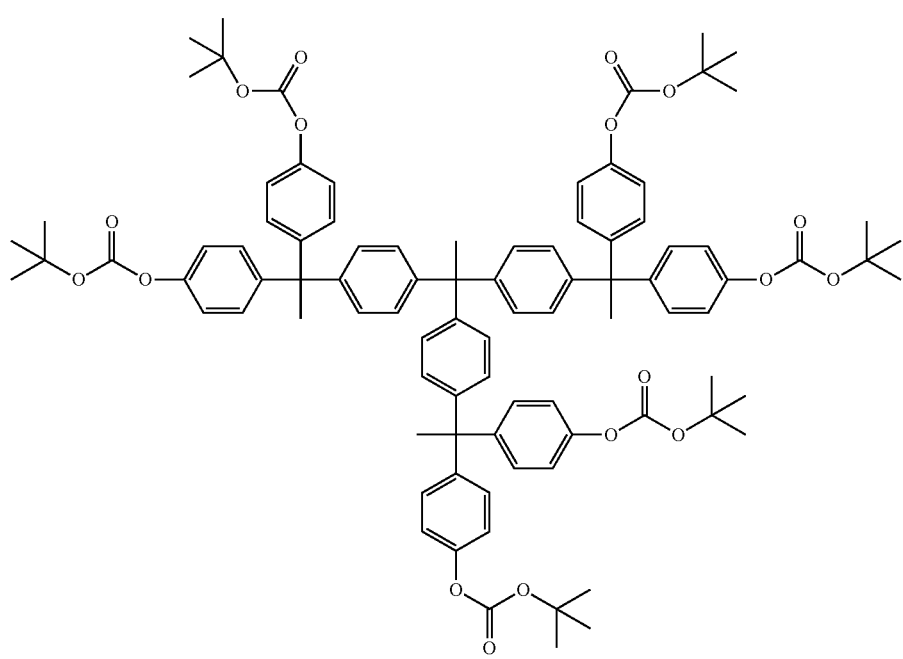
(d)
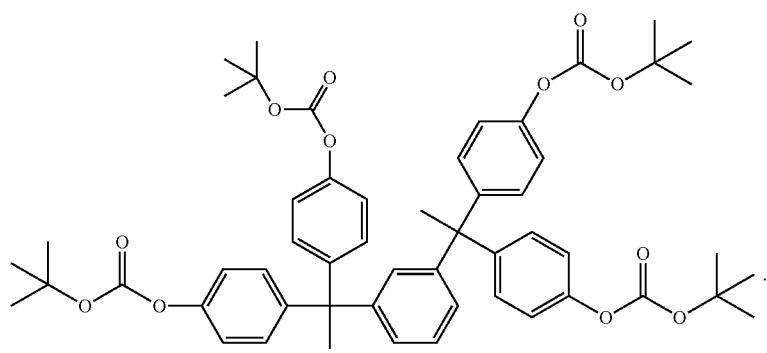
(e)
16. The thin film transistor of claim 1, wherein the dielectric layer is formed from a solution comprising:
   the molecular glass;
   a crosslinking agent; and
   an optional catalyst.
17. The thin film transistor of claim 16, wherein the catalyst is an acid.
* * * * *